United States Patent
Ifuku et al.

(10) Patent No.: US 7,215,067 B2
(45) Date of Patent: May 8, 2007

(54) FERROELECTRIC THIN FILM ELEMENT, PIEZOELECTRIC ACTUATOR AND LIQUID DISCHARGE HEAD

(75) Inventors: Toshihiro Ifuku, Kanagawa (JP); Tetsuro Fukui, Kanagawa (JP); Takanori Matsuda, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 217 days.

(21) Appl. No.: 10/772,260

(22) Filed: Feb. 6, 2004

(65) Prior Publication Data

US 2004/0155559 A1 Aug. 12, 2004

(30) Foreign Application Priority Data

Feb. 7, 2003 (JP) ............... 2003-031669
Feb. 7, 2003 (JP) ............... 2003-031680

(51) Int. Cl.
*H01L 41/04* (2006.01)
*H01L 41/16* (2006.01)
*H01L 41/24* (2006.01)

(52) U.S. Cl. ............ 310/357; 310/358; 310/360

(58) Field of Classification Search ........ 310/357–358, 310/360; 257/347, 295, 627–628; 252/62.9 R, 252/62 PZ; 501/134
See application file for complete search history.

(56) References Cited

U.S. PATENT DOCUMENTS 5,739,563 A 4/1998 Kawakubo et al. ......... 257/295
6,005,270 A * 12/1999 Noguchi ..................... 257/315
6,060,735 A * 5/2000 Izuha et al. ................. 257/295
6,077,716 A * 6/2000 Yoo ............................. 438/3
6,653,211 B2 11/2003 Unno et al. ................. 438/479
6,930,339 B2 * 8/2005 Higuchi et al. ............. 257/295

(Continued)

FOREIGN PATENT DOCUMENTS

JP 06326270 A * 11/1994

(Continued)

OTHER PUBLICATIONS

S. Hyun, et al., Anisotropic Tuning Behaviour in Epitaxial BST Thin Films, App. Physics Letters, vol. 77, No. 19, Nov. 6, 2000, pp. 3084.*

(Continued)

*Primary Examiner*—Thomas M. Dougherty
*Assistant Examiner*—J. Aguirrechea
(74) *Attorney, Agent, or Firm*—Fitzpatrick, Cella, Harper & Scinto (57) ABSTRACT

A ferroelectric thin film element comprises a substrate and an epitaxial ferroelectric thin film provided on the substrate. The thin film satisfies $z/z_0 > 1.003$ and $0.997 \leq x/x_0 \leq 1.003$, where a crystal face of said thin film parallel to a crystal face of a surface of the substrate is taken as a Z crystal face, a face spacing of the Z crystal face is taken as z, a face spacing of the Z crystal face of a material constituting the thin film in a bulk state is taken as $z_0$, a crystal face of the thin film perpendicular to the Z crystal face is taken as an X crystal face, a face spacing of the X crystal face is taken as x and a face spacing of the X crystal face of the material constituting the thin film in a bulk state is taken as $x_0$.

14 Claims, 5 Drawing Sheets

U.S. PATENT DOCUMENTS

| | | | |
|---|---|---|---|
| 2002/0076875 A1 | 6/2002 | Wasa et al. | 438/207 |
| 2002/0140320 A1 | 10/2002 | Unno et al. | 310/328 |
| 2003/0196745 A1 | 10/2003 | Fukui et al. | 156/230 |
| 2003/0197174 A1 | 10/2003 | Matsuda | 257/43 |

FOREIGN PATENT DOCUMENTS

| | | |
|---|---|---|
| JP | 8-139292 | 5/1996 |
| JP | 8-186182 | 7/1996 |
| JP | 9-37392 | 2/1997 |
| JP | 10-223476 | 8/1998 |
| JP | 10261933 A * | 9/1998 |
| JP | 10270939 A * | 10/1998 |
| JP | 2000223662 A * | 8/2000 |
| JP | 2000-256098 | 9/2000 |
| JP | 2001-313429 | 11/2001 |

OTHER PUBLICATIONS

*Note: U.S. Patent No. 5,739,563 is a counterpart to JP 8-139292.

* cited by examiner

FERROELECTRIC THIN FILM ELEMENT, PIEZOELECTRIC ACTUATOR AND LIQUID DISCHARGE HEAD

BACKGROUND OF THE INVENTION

1. Field of the Invention

The present invention relates to a ferroelectric thin film element, and more particularly to an element in which a spontaneous polarization of a ferroelectric thin film is involved in an improvement in device characteristics, such as a non-volatile memory. The present invention also relates to a piezoelectric actuator utilizing a piezoelectric property of an epitaxial film and a liquid discharge head equipped with a piezoelectric actuator unit of a configuration including such a piezoelectric actuator.

2. Description of the Related Art

As a memory medium for a non-volatile memory and the like, there is recently desired a memory apparatus employing a ferroelectric thin film having a high performance (hereinafter called ferroelectric memory). For securing optimal device characteristics and reproducibility in the ferroelectric memory, the ferroelectric thin film is required to have a large spontaneous polarization (residual polarization), a small temperature dependence of the residual polarization, and a small deterioration of inversion of polarization in repeated cycles.

As the ferroelectric material, lead zirconate titanate [Pb(Zr, Ti)$O_3$] (also represented as PZT) is principally employed. PZT is a solid solution of lead zirconate and lead titanate, and a solid solution of a molar ratio of about 1:1 is considered to have a large spontaneous polarization, capable of inversion even under a weak electric field and excellent as a memory medium. As PZT has a relatively high transition temperature (Curie temperature) between a ferroelectric phase and a paraelectric phase of about 300° C. or higher, there is little concern that the memorized content is lost by heat in a temperature range in which ordinary electronic circuits are used (120° C. or lower).

However, even with an excellent ferroelectric thin film such as a PZT thin film, it is difficult to obtain satisfactory device characteristics in a ferroelectric thin film formed by a polycrystalline member, because of a distortion of physical properties at the crystal grain boundary. Therefore, in consideration of the device characteristics of the ferroelectric element, there is desired an epitaxial thin film as close to a complete single crystal as possible.

Also for integration of the ferroelectric devices, a thinner film formation of the ferroelectric thin film is effective, but in case a film thickness of the ferroelectric thin film becomes equal to or less than 100 nm, the spontaneous polarization of the ferroelectric thin film tends to be lost even if it is an epitaxial film, and a deterioration in the residual polarization or the fatigue resistance of the ferroelectric thin film becomes conspicuous. For this reason, in order to reduce the thickness of the ferroelectric thin film, certain measures are required for maintaining the spontaneous polarization of the ferroelectric thin film at a sufficiently high level.

In order to increase the spontaneous polarization of the ferroelectric thin film, there can be employed a method of utilizing a mismatch in the thermal expansion coefficient between the substrate and the ferroelectric thin film (Japanese Patent Application Laid-Open No. H08-186182), or a method of utilizing a misfit in the lattices of the substrate and the ferroelectric thin film (Japanese Patent Application Laid-Open No. H08-139292). These methods can cause a compression stress to be applied to the ferroelectric thin film, thereby increasing the spontaneous polarization of the ferroelectric thin film.

However the prior method of increasing the spontaneous polarization by applying a compression stress to the ferroelectric thin film, though capable of increasing the spontaneous polarization, cannot improve the deterioration in the residual polarization or the fatigue resistance of the ferroelectric thin film. It is estimated that a stress applied in the ferroelectric thin film along a planar direction of the substrate is significantly involved in the aforementioned deterioration of the characteristics of the ferroelectric thin film, and, in case a large compression stress is applied to the ferroelectric thin film in the prior method, the stress applied along the planar direction of the substrate acts on the ferroelectric thin film, thereby further increasing the deterioration in the characteristics of the ferroelectric thin film.

On the other hand, a printer utilizing an ink jet recording apparatus is widely popular as a printing apparatus for a personal computer or the like, because of satisfactory printing ability, simple handling and low cost. An ink jet head employed in such ink jet recording apparatus is a liquid discharge head for discharging ink, and is available in various types such as one generating a bubble in the ink by thermal energy and discharging an ink droplet by a pressure wave caused by such bubble, one suctioning and discharging an ink droplet by an electrostatic force, and one suctioning and discharging an ink droplet utilizing a pressure wave generated by an actuator having a vibrator such as a piezoelectric element or an electrostriction element.

A liquid discharge head utilizing a piezoelectric actuator generally has a pressure chamber communicating with a liquid supply chamber, and a liquid discharge port communicating with such pressure chamber, and, in a part of the pressure chamber, there is provided a vibrating plate on which the piezoelectric actuator is adjoined or directly formed. In the liquid discharge head of such configuration, a predetermined voltage is applied to the piezoelectric actuator to cause an extension-contraction motion of the piezoelectric element, thereby inducing a bending vibration and pressurizing the liquid in the pressure chamber to discharge a liquid droplet from the liquid discharge port.

A color ink jet recording apparatus is currently becoming popular, and there is being requested an improvement in the printing performance, particularly for a higher resolution and a higher printing speed. To this end, it is attempted to achieve a high resolution and high-speed printing by a multi-nozzle head structure through a miniaturization of the liquid discharge head for liquid discharge. For miniaturizing the liquid discharge head, it is necessary to reduce the dimensions of the piezoelectric actuator for liquid discharge.

In the liquid discharge head utilizing the piezoelectric actuator, a compact piezoelectric actuator has conventionally prepared by fine working, such as grinding and polishing, of a piezoelectric member prepared by sintering, but it is separately being investigated to develop an ultra-small piezoelectric actuator having a high precision by forming a piezoelectric member as a film and utilizing a fine working technology developed in the semiconductor field. Also, in view of achieving a higher performance, such a piezoelectric film is preferably a film having a single crystal structure or a crystal orientation property, and a heteroepitaxial growing technology is being actively developed.

Also, in the case of employing a ferroelectric member as a piezoelectric member, a large spontaneous polarization is one of the characteristics desired for the ferroelectric member. However, in the case of a film, a reduction in the film thickness of the ferroelectric film tends, even if the ferroelectric film is an epitaxial film, to lose the spontaneous polarization of the ferroelectric film, and certain measures are required for maintaining the spontaneous polarization of the epitaxial ferroelectric film at a sufficiently high level.

In order to increase the spontaneous polarization of the epitaxial ferroelectric film, as stated above, there can be employed a method of utilizing a mismatch in the thermal expansion coefficient between the substrate and the ferroelectric film (Japanese Patent Application Laid-Open No. H08-186182), or a method of utilizing a misfit in the lattices of the substrate and the ferroelectric film (Japanese Patent Application Laid-Open No. H08-139292). These methods can form an epitaxial ferroelectric film to which a compression stress is applied, thereby obtaining an epitaxial ferroelectric film with a high spontaneous polarization.

However, the prior method of forming an epitaxial ferroelectric film involving a compression stress therein to increase the spontaneous polarization thereby improving the piezoelectric property, though capable of increasing the spontaneous polarization, cannot resolve drawbacks such as deterioration in the characteristics of the piezoelectric actuator over the course of repeated uses or destruction of the piezoelectric actuator induced by a leak current at the application of voltage. It is estimated that a stress applied in the ferroelectric thin film along a planar direction of the substrate is significantly involved in the aforementioned deterioration in the characteristics and destruction of the piezoelectric actuator, and, in an epitaxial ferroelectric film prepared by the prior method and subjected to a large compression stress, the stress applied along the planar direction of the substrate acts on the ferroelectric thin film, thereby further increasing the deterioration of the durability characteristics of the piezoelectric actuator.

SUMMARY OF THE INVENTION

An object of the present invention is to provide a ferroelectric thin film element which not subject to deterioration of its characteristics upon application of a small stress applied in the ferroelectric thin film along a planar direction of the substrate, shows a high spontaneous polarization of the ferroelectric thin film and is suitable for thin film formation. It is effective for an element in which the spontaneous polarization of the ferroelectric thin film is involved in improving the characteristics of the ferroelectric thin film element, for example, a non-volatile memory. In heteroepitaxial growing technology, it is preferable to reduce the stress generated in the vicinity of the boundary between the substrate and the formed ferroelectric thin film and applied along the planar direction of the substrate. It is estimated that the stress generated by a misfit in the crystal lattices between the substrate and the ferroelectric thin film and applied in the planar direction of the substrate constitutes a cause of film peeling of the ferroelectric thin film, so that such film peeling can be prevented by a reduction in the aforementioned stress applied in the planar direction of the substrate.

Another object of the present invention is to provide a ferroelectric thin film element having a substrate and an epitaxial ferroelectric thin film provided on the substrate, in which the epitaxial ferroelectric thin film (1) satisfies a relation $z/z_0 > 1.003$, wherein a crystal face parallel to a crystal face of a surface of the substrate, among crystal faces of the epitaxial ferroelectric thin film, is taken as a Z crystal face, a face spacing of the Z crystal face is taken as z and a face spacing of the Z crystal face of a material constituting the epitaxial ferroelectric thin film in a bulk state is taken as $z_0$, and (2) also satisfies a relation $0.997 \leq x/x_0 \leq 1.003$, wherein one of the crystal faces of the epitaxial ferroelectric thin film perpendicular to the Z crystal face is taken as an X crystal face, a face spacing of the X crystal face is taken as x and a face spacing of the X crystal face of the material constituting the epitaxial ferroelectric thin film in a bulk state is taken as $x_0$. (It is understood that the term "crystal face" used herein is interchangeable with the term "crystal plane.") According to the present invention, there can be obtained a ferroelectric thin film element free from deterioration of its characteristics, showing a high spontaneous polarization and suitable for thin film formation.

Still another object of the present invention is to provide a piezoelectric actuator having excellent characteristics, by forming an epitaxial ferroelectric film which has a reduced stress acting on the epitaxial ferroelectric film along a planar direction of the substrate, which is free from film peeling or deterioration of the characteristics of the epitaxial ferroelectric film, which enables formation of a large area, which has excellent piezoelectric characteristics and which is suitable for thin film formation. Also, another object of the present invention is to provide a liquid discharge head, particularly a liquid discharge head adapted for use in an ink jet recording apparatus, provided with a piezoelectric actuator unit of a configuration including such a piezoelectric actuator. In heteroepitaxial growing technology, it is preferable to reduce the stress generated in the vicinity of the boundary between the substrate and the formed epitaxial ferroelectric film and applied along a planar direction of the substrate. By reducing the stress generated by a misfit in lattices of the substrate and the epitaxial ferroelectric film and applied in the planar direction of the substrate, it is rendered possible to prevent film peeling of the epitaxial ferroelectric film, thereby enabling improved productivity by increasing the size of the substrate.

Still another object of the present invention is to provide a piezoelectric actuator having a substrate and an epitaxial ferroelectric film provided on the substrate, in which the epitaxial ferroelectric film (1) satisfies a relation $z/z_0 > 1.003$, wherein a crystal face parallel to a crystal face of a surface of the substrate, among crystal faces of the epitaxial ferroelectric film, is taken as a Z crystal face, a face spacing of the Z crystal face is taken as z and a face spacing of the Z crystal face of a material constituting the epitaxial ferroelectric film in a bulk state is taken as $z_0$, and (2) also satisfies a relation $0.997 \leq x/x_0 \leq 1.003$, wherein one of the crystal faces of the epitaxial ferroelectric film perpendicular to the Z crystal face is taken as an X crystal face, a face spacing of the X crystal face is taken as x and a face spacing of the X crystal face of the material constituting the epitaxial ferroelectric film in a bulk state is taken as $x_0$. Still another object of the present invention is to provide a liquid discharge head for discharging a liquid, utilizing the aforementioned piezoelectric actuator. According to the present invention, there can be obtained a piezoelectric actuator and a liquid discharge head which are free from film peeling and deterioration of the characteristics of the epitaxial ferroelectric film, which show excellent piezoelectric characteristics, and which are suitable for film formation and miniaturization and for forming a large area.

DETAILED DESCRIPTION OF THE PREFERRED EMBODIMENTS

A ferroelectric thin film element of the present invention has a structure including at least a substrate and an epitaxial ferroelectric thin film formed thereon. The epitaxial ferroelectric thin film formed on the substrate of the ferroelectric thin film element of the present invention is a ferroelectric thin film having a single crystal structure or a crystal orientation property.

A piezoelectric actuator of the present invention has a structure including at least a substrate, an epitaxial ferroelectric film formed thereon and electrodes formed on and under the epitaxial ferroelectric film. The epitaxial ferroelectric film formed on the substrate is a ferroelectric film having a single crystal structure or a crystal orientation property, and electrodes are formed on and under it, so as to sandwich the epitaxial ferroelectric film.

The epitaxial ferroelectric film of the present invention satisfies a relation $z/z_0 > 1.003$, wherein a crystal face parallel to a crystal face of a surface of the substrate, among crystal faces of the epitaxial ferroelectric film, is taken as a Z crystal face, a face spacing of the Z crystal face is taken as z and a face spacing of the Z crystal face of a material constituting the epitaxial ferroelectric film in a bulk state is taken as $z_0$. The epitaxial ferroelectric film preferably satisfies a relation $z/z_0 > 1.004$, more preferably a relation $z/z_0 > 1.005$. If the relation $z/z_0 > 1.003$ is satisfied, the spontaneous polarization of the epitaxial ferroelectric film can be increased even with such a film thickness as 2 to 100 nm. Also, if such a relation is satisfied, the epitaxial ferroelectric film can show a high spontaneous polarization even with a film thickness of 10 μm or less, thereby improving the piezoelectric characteristics.

The value of $z/z_0$ is not particularly restricted at the upper limit, but is generally 1.050 or less, preferably 1.020 or less and more preferably 1.010 or less. An upper limit value of $z/z_0$ selected as 1.050 or less allows easy formation of an epitaxial film of a satisfactory crystallinity.

Furthermore, the epitaxial ferroelectric film of the present invention satisfies a relation $0.997 \leq x/x_0 \leq 1.003$, wherein one of crystal faces of the epitaxial ferroelectric film perpendicular to the Z crystal face is taken as an X crystal face, a face spacing of the X crystal face is taken as x and a face spacing of the X crystal face of the material constituting the epitaxial ferroelectric film in a bulk state is taken as $x_0$. The epitaxial ferroelectric film formed on the substrate of the ferroelectric film element of the present invention preferably satisfies a relation $0.998 \leq x/x_0 \leq 1.002$, more preferably a relation $0.999 \leq x/x_0 \leq 1.001$. If the aforementioned relation is satisfied, there can be obtained a ferroelectric thin film element which shows a small stress applied in it along a planar direction of the substrate, which is free from deterioration of the residual polarization or the fatigue resistance of the epitaxial ferroelectric film and which is free from film peeling. Also, if the aforementioned relation is satisfied, there can be obtained a piezoelectric actuator which shows a small stress applied to the epitaxial ferroelectric film along the planar direction of the substrate, and has excellent durability characteristics free from deterioration of the characteristics of the piezoelectric actuator over the course of repeated use and from destruction of the epitaxial ferroelectric film associated with a leak current at the application of a voltage.

In the following there will be explained specific embodiments of the present invention, required for realizing such a ferroelectric element and piezoelectric actuator.

The material constituting the epitaxial ferroelectric film is not particularly restricted, and can be suitably selected from materials showing ferroelectricity. Examples of such materials include $BaTiO_3$, $PbTiO_3$, $PbZrO_3$, $YMnO_3$, $Bi_4Ti_3O_{12}$, $SrBi_2Ta_2O_9$ and $(Sr, Ba)Nb_3$. Examples of materials showing a strong ferroelectricity at the normal temperature are lead-based perovskite oxide materials generally represented by PZT. Also, there can be employed a composition in which the aforementioned main components are doped with a trace element such as La, for example, La-doped PZT [(Pb, Ta)(Zr, Ti)O_3] (also represented as PLZT). In the case of a piezoelectric actuator, there can be employed, as a material showing a strong piezoelectric property, a relaxing ferroelectric member (relaxer) represented by lead niobate zincate-lead titanate (also represented as PZN-PT) or lead niobate magnesiate-lead titanate (also represented as PMN-PT).

The substrate usable in the preparation of the ferroelectric thin film element and the piezoelectric actuator of the present invention is preferably a single crystal member on which a ferroelectric film can be epitaxially grown. A preferred substrate is, for example, a single crystal substrate such as a substrate of MgO, $SrTiO_3$, $(La, Sr)TiO_3$, $Al_2O_3$, Pt or Si. In particular, there is preferred $SrTiO_3$, $(La, Sr)TiO_3$, MgO or Pt having a lattice constant close to that of a lead-based material, which generally shows an excellent ferroelectric property, such as PZT. For example, a single crystal of $SrTiO_3$, $(La, Sr)TiO_3$, Pt or MgO has a cubic crystal structure. Crystals of these materials in a bulk state have, at room temperature, an a-axis lattice constant respectively of 3.905, 3.907, 3.923 and 4.211 Å. In the case of forming, on a single crystal substrate prepared from the above-mentioned material in such a manner that a (100) face constitutes the substrate surface, an epitaxial ferroelectric film having a tetragonal crystal structure in such a manner that a Z-crystal face of a PZT film constitutes a (001) face, a material constituting the ferroelectric film is preferably PZT of a composition of Zr:Ti=52:48, having a tetragonal crystal structure and an a-axis lattice constant of 4.306 Å in a bulk state at room temperature.

It is also effective to provide a buffer layer between the substrate and the epitaxial ferroelectric film in order to obtain an epitaxial ferroelectric film of an excellent single crystal structure or an excellent crystal orientation property. The thickness of the buffer layer is not particularly restricted, but it is usually 0.5 nm or larger, preferably 1 nm or larger and more preferably 2 nm or larger, since it is preferable that the buffer layer has a high crystallinity.

In the case of a ferroelectric element, the thickness is preferably such as not to adversely affect the characteristics thereof, and the thickness of the buffer layer is usually 100 nm or less, preferably 50 nm or less and more preferably 10 nm or less. For example, in the case of forming an epitaxial ferroelectric thin film constituted of PZT on a Pt substrate, it is possible to obtain an epitaxial ferroelectric thin film of a better single-crystal quality by forming a PbTiO$_3$ layer of a thickness of 2 to 10 nm as a buffer layer and forming an epitaxial ferroelectric thin film on such buffer layer. This is presumably because the epitaxial growth of a single crystal can be controlled more easily in case Ti is richer than Zr in an initial growth stage of the epitaxial ferroelectric thin film constituted of PZT.

Also, in the case of a piezoelectric actuator, the thickness of the buffer layer is preferably such as not to adversely affect the characteristics thereof, and the thickness of the buffer layer is usually 1000 nm or less, preferably 500 nm or less and more preferably 100 nm or less. For example, in the case of forming an epitaxial ferroelectric film constituted of PZT on a Pt substrate, it is possible to obtain an epitaxial ferroelectric film of a better single-crystal quality by forming a PbTiO$_3$ layer of a thickness of 2 to 1000 nm as a buffer layer and forming an epitaxial ferroelectric film on such buffer layer. This is presumably because the epitaxial growth of a single crystal can be controlled more easily if Ti is richer than Zr in an initial growth stage of the epitaxial ferroelectric film constituted of PZT.

It is also effective to utilize a buffer layer in order to obtain an epitaxial ferroelectric film having a single crystal structure or a crystal orientation property on a substrate prepared from a material such as Al$_2$O$_3$ or Si, having a large difference, in respect of the lattice constant, from PZT. For example, it is possible to obtain an epitaxial ferroelectric film of a better single-crystal quality, on a substrate prepared on a Si(100) substrate by an epitaxial growth of yttria-stabilized zirconium oxide (also represented as YSZ) with a (100) face thereof parallel to the substrate surface and by an epitaxial growth thereon of Pt(111), by forming an epitaxial ferroelectric film constituted of PZT(111) across a buffer layer constituted of PbTiO$_3$. This is presumably because, with respect to an a-axis lattice constant of YSZ of 5.16 Å, a crystal face (–110) perpendicular to the Pt(111) crystal face of the cubic crystal has a face spacing of 5.55 Å, which is relatively close to the face spacing of the (100) face of YSZ.

Also, even on a substrate lacking an orientation property, such as stainless steel or glass, it is possible to epitaxially grow a ferroelectric film having a single crystal structure or a crystal orientation property, utilizing a buffer layer. For example, since Pt has a property of spontaneous orientation in [111], a Pt film formed, for example, on a glass substrate provides a high-orientation film having a (111) crystal face parallel to the substrate surface. It is possible to grow thereon an epitaxial ferroelectric film of PZT (111), across a buffer layer of TbTiO$_3$ (111).

As explained above, the buffer layer is a useful means for obtaining an epitaxial ferroelectric film having a single crystal structure or a crystal orientation property.

In the case of utilizing an epitaxial ferroelectric film in a memory medium such as a non-volatile memory, electrodes are required on and under the epitaxial ferroelectric film. Also, a piezoelectric actuator has a structure including upper and lower electrodes sandwiching an epitaxial ferroelectric film. Therefore, it is desirable that at least one of the substrate or the buffer layer constituting the ferroelectric thin film element or the piezoelectric actuator is electroconductive. As a material for the electrode, Pt or Au is ordinarily employed, but it is also possible to use Cr, Ru, Ir, etc. or an oxide electrode material such as SrRuO$_3$ or (La, Sr)TiO$_3$. There can also be employed an electrode material of a multi-layered structure intended for a greater adhesion or an ohmic contact of the electrode, such as Pt/Ti. The conductive material employed for the electrode preferably has a specific resistivity of 0.01 Ω·cm or less.

In the following, there will be shown specific examples of a layer structure of the ferroelectric thin film element and the piezoelectric actuator of the present invention.

The ferroelectric thin film element of the present invention has a structure including at least a substrate and an epitaxial ferroelectric thin film epitaxially formed on the substrate and having a single crystal structure or a crystal orientation property, but, in an application for an electronic device such as a non-volatile memory, electrodes are often required on and under the epitaxial ferroelectric thin film. Therefore the configuration is represented (in the examples given below) by: upper electrode//ferroelectric thin film//buffer layer//substrate; and a substrate or a buffer layer having conductivity is indicated (in the examples given below) by an underline. However, this is not essential if the ferroelectric thin film element is applied to a device not necessarily requiring a conductive layer in the buffer layer, such as a ferroelectric gate transistor. Also, among these layers, at least the epitaxial ferroelectric thin film is in an epitaxial relationship with an underlying film.

The piezoelectric actuator of the present invention has a structure including at least a substrate, an epitaxial ferroelectric film epitaxially formed on the substrate and having a single crystal structure or a crystal orientation property, and electrodes positioned on and under the epitaxial ferroelectric film so as to sandwich it. Therefore the specific layer configuration of the piezoelectric actuator is represented in the following by: upper electrode//ferroelectric thin film//buffer layer//substrate, and a substrate or a buffer layer having conductivity and serving as an electrode is indicated by an underline. The piezoelectric actuator of the present invention is particularly preferably applied to an actuator unit in a liquid discharge head. The piezoelectric actuator of the present invention particularly preferably has a configuration of employing, as the substrate, a single crystal Si substrate bearing a SiO$_2$ layer formed by thermal oxidation of the substrate surface in which such substrate serves as a vibrating plate. Among these layers on the substrate, at least the epitaxial ferroelectric film is in an epitaxial relationship with an underlying layer, having a crystalline property.

Ex. 1: Pt//PZT(001)/PbTiO$_3$(001)//Pt(100)/MgO(100)//Si(100)

Ex. 2: Pt//PZT(001)/PbTiO$_3$(001)//Pt(100)/SrTiO$_3$(100)//Si (100)

Ex. 3: Au//PZT(001)/(La,Sr)TiO$_3$(100)/Si(100)/SiO$_2$//Si(100)

Ex. 4: Pt//PZT(001)/PbTiO$_3$(001)//Pt(100)//Al$_2$O$_3$(100)//Si(100)

Ex. 5: Pt//PZT(111)/PbTiO$_3$(111)//Pt(111)//YSZ(100)/Zr//Si (100)

Ex. 6: Ag//PZT(001)/PbTiO$_3$(001)//Pt(100)/LaAl$_3$(100)//Si(100)

Ex. 7: Au//PZT(001)/PbTiO$_3$(001)//Pt(100)//YSZ (111)/SiO$_2$//Si(111)

Ex. 8: Au//PZT(001)//(La,St)TiO$_3$(100)//YSZ(111)//Si(111)

Ex. 9: Pt//PZT(111)/PbTiO$_3$(111)//Pt(111)/YSZ (100)//Si (100)

Ex. 10: Pt//PZT(111)//Pt(111)//glass

Ex. 11: Pt//PZT(111)//Pt(111)/MgO//SUS

Ex. 12: Pt//PZT(111)/PbTiO$_3$(111)//Pt(111)/MgO(111)//Si(100)

Ex. 13: Au//PZT(001)//SrRuO$_3$(001)//Si(100)

Ex. 14: Au//PZT(001)/PbTiO$_3$(001)//Pt(100)//MgO(100)

Ex. 15: Au//PZT(001)/PbTiO$_3$(001)//Pt(100)//SrTiO (100)

Ex. 16: Pt//PZT(001)//(La,Sr)O$_3$(100)

Ex. 17: Au//PZT(001)/PbTiO$_3$(001)//Pt(100)//Al$_2$O$_3$(100)
Ex. 18: Pt//PZT(001)//Ir(100)/ZrN(100)//Si(100)
Ex. 19: Pt//YMnO$_3$(0001)//Y$_2$O$_3$(111)//Si (111)
Ex. 20: Pt//PbZrO$_3$(101)//(La,Sr)O$_3$(100)

In the foregoing, there are principally shown examples employing PZT as the material constituting the epitaxial ferroelectric film, but the material constituting the epitaxial ferroelectric film may be a composition doped with a trace element for example La, such as La-doped PZT. Also, the material constituting the ferroelectric film may be not based on lead but can also be a non-lead ferroelectric material such as BaTiO$_3$ or SrBi$_2$Ta$_2$O$_9$.

The ferroelectric thin film element of the present invention can be prepared by epitaxially forming a ferroelectric thin film on a substrate. The piezoelectric actuator of the present invention can be prepared by epitaxially forming at least a ferroelectric film on a substrate and providing electrodes on and under such epitaxial ferroelectric film. The piezoelectric actuator of the present invention has a structure including at least a substrate, an epitaxial ferroelectric film formed on the substrate and having a single crystal structure or a crystal orientation property, and electrode films formed on and under the epitaxial ferroelectric film and having a crystal orientation property.

Such epitaxial ferroelectric film can be formed, for example, by a sputtering method, a sol-gel method, a metalorganic chemical vapor deposition (also represented as MOCVD) method, an evaporation method, or a laser ablation method. Film forming conditions vary according to the film forming method and the ferroelectric material to be employed, and can be suitably selected.

For example, in the case of a sputtering method, an RF magnetron sputtering method is preferable. Film forming conditions in the RF magnetron sputtering method include a substrate temperature at film formation within a range from 500 to 700° C., an argon/oxygen atmosphere with an argon/oxygen ratio within a range from 20/1 to 50/1, a gas pressure from 0.2 Pa to 0.5 Pa, an RF charged electric power from 0.5 to 1.2 W/cm$^2$, and a substrate cooling rate after film formation of 65° C./min. or higher. More preferred conditions include an argon/oxygen ratio within a range from 30/1 to 50/1, a gas pressure from 0.2 Pa to 0.3 Pa, an RF charged electric power from 0.5 to 0.8 W/cm$^2$, and a substrate cooling rate after film formation of 100° C./min. or higher. It is particularly preferable to execute the cooling to 180° C. with the above-mentioned speed, and it is also preferable to execute a pre-sputtering, prior to film formation, briefly with a power equal to or less than a half of the RF charged electric power at film formation and to immediately proceed to film formation. Film formation can be executed by suitably selecting conditions from those shown above, according to a desired composition of the epitaxial ferroelectric film. Particularly in a system including a dopant such as La, it is possible to reduce the substrate temperature and to select a somewhat higher RF charge electric power. The heating of the substrate is preferably executed by infrared heating or resistor heating. In such a case, by maintaining a fluctuation of the substrate temperature within a range of ±5%, it is possible to obtain an epitaxial ferroelectric film of uniform and stable characteristics even in the case of forming an epitaxial ferroelectric film on a substrate of a large area.

For forming the epitaxial ferroelectric film of the present invention, a sputtering method is particularly preferable. This is because the sputtering method can easily provide an epitaxial ferroelectric film of satisfactory crystallinity having a crystal structure defined in the present invention. For example, in the case of a PZT(001) film epitaxially grown on a Pt(100) film, when a crystal orientation rate thereof becomes 90% or higher, a ratio $z/z_0$ between a face spacing z of the (001) face present parallel to the substrate surface and constituting the Z crystal face of the epitaxial ferroelectric film and a face spacing $z_0$ of the (001) face constituting the Z crystal face of PZT in a bulk state becomes larger than 1.003, and a ratio $x/x_0$ between a face spacing x of a (100) face present perpendicularly to the Z crystal face and constituting the X crystal face of the epitaxial ferroelectric film and a face spacing $x_0$ of the (100) face constituting the X crystal face of PZT in a bulk state assumes a state $0.997 \leq x/x_0 \leq 1.003$. When the crystal orientation rate further increases, the ratio $x/x_0$ of the face spacing of the (100) face in the epitaxial ferroelectric film and in the bulk state becomes closer to 1.

In the present invention, the crystal orientation rate means, in an X-ray measurement with an X-ray incident angle θ to the Z crystal face of the epitaxial ferroelectric film, the proportion of the reflection peak intensity of all the Z faces of the epitaxial ferroelectric film to all the reflection peak intensities measured by a 2θ/θ method. For example, in an epitaxial ferroelectric film having a tetragonal (001) face crystal orientation, it means, in an X-ray diffraction pattern of the epitaxial ferroelectric film measured by the 2θ/θ method, the proportion of the sum of all the reflection peak intensities attributed to (00 L) faces (L=1, 2, 3, . . . , n) with respect to the sum of all the observed reflection peak intensities.

Also, the epitaxial ferroelectric thin film of the ferroelectric thin film element of the present invention preferably has a thickness of 2 to 100 nm. Since the ferroelectricity of an epitaxial ferroelectric film is developed depending on the skeleton of the crystal lattice and the atom arrangement, the film thickness is usually 2 nm or larger, preferably 5 nm or larger. On the other hand, in the case of applying the ferroelectric thin film element of the present invention in a highly integrated device such as a ferroelectric memory, since a thinner film of the epitaxial ferroelectric film is effective for such integration and for low-voltage driving, the film thickness of the epitaxial ferroelectric thin film is preferably selected as 100 nm or less if application to such field is intended.

In the piezoelectric actuator of the present invention, the epitaxial ferroelectric film preferably has a smaller thickness, particularly from 100 nm to 10 μm. For example, if a large piezoelectric displacement is required for the piezoelectric actuator, such as in a liquid discharge head for ink discharge, a smaller thickness of the epitaxial ferroelectric film allows the achievement of a larger displacement with a lower voltage. In the piezoelectric actuator, however, the epitaxial ferroelectric film is subjected to a voltage application of several tens of volts, and, in order to prevent destruction of the film by a variation in such voltage or deterioration of the piezoelectric characteristics by a leak current, the thickness of the epitaxial ferroelectric film is generally selected as 100 nm or larger, preferably 500 nm or larger. On the other hand, a larger thickness of the epitaxial ferroelectric film increases the frequency of defect generation such as film peeling, and it becomes difficult to obtain an epitaxial ferroelectric film having a single crystal structure or crystal orientation property, in all the aforementioned ferroelectric materials, so that the thickness of the epitaxial ferroelectric film is preferably selected generally to be 10 μm or less.

In the present invention, the epitaxial ferroelectric film is controlled by the crystal system and the face orientation thereof as explained in the following, thereby obtaining a ferroelectric film without deterioration in the characteristics thereof, showing a high spontaneous polarization and suitable for thin film formation. In an epitaxial ferroelectric film with a tetragonal crystal system, the epitaxial ferroelectric film has a spontaneous polarization in a direction [001]. Therefore, the spontaneous polarization becomes larger as a face spacing of the (001) face of the epitaxial ferroelectric film becomes longer than the face spacing of the (001) face in the bulk state. Consequently, in a tetragonal crystal system, the Z crystal face is preferably a (001) face.

On the other hand, in an epitaxial ferroelectric film with a rhombohedral crystal system, the epitaxial ferroelectric film has a spontaneous polarization in a direction [111]. Therefore, the spontaneous polarization becomes larger as a face spacing of the (111) face of the ferroelectric film becomes longer than the face spacing of the (111) face in the bulk state. Consequently, in the epitaxial ferroelectric film of a rhombohedral crystal system, the Z crystal face is preferably a (111) face. Similarly, in an epitaxial ferroelectric film with a hexagonal crystal system, the epitaxial ferroelectric film has a spontaneous polarization in a direction [0001]. Therefore the spontaneous polarization becomes larger as a face spacing of the (0001) face of the epitaxial ferroelectric film becomes longer than the face spacing of the (0001) face in the bulk state. Consequently, in the epitaxial ferroelectric film of a rhombohedral crystal system, the Z crystal face is preferably a (0001) face. Furthermore, in an epitaxial ferroelectric film with a rhombic crystal system, the epitaxial ferroelectric film has a spontaneous polarization in a direction [011]. Therefore the spontaneous polarization becomes larger as a face spacing of the (011) face of the epitaxial ferroelectric film becomes longer than the face spacing of the (011) face in the bulk state. Consequently, in the epitaxial ferroelectric film of a rhombic crystal system, the Z crystal face is preferably a (011) face.

The hexagonal crystal system is represented not by Miller's notation (hkl) utilized in the notation of crystal faces but by Brave-Millar's notation (hikl) often employed in the hexagonal system.

Figure 5:
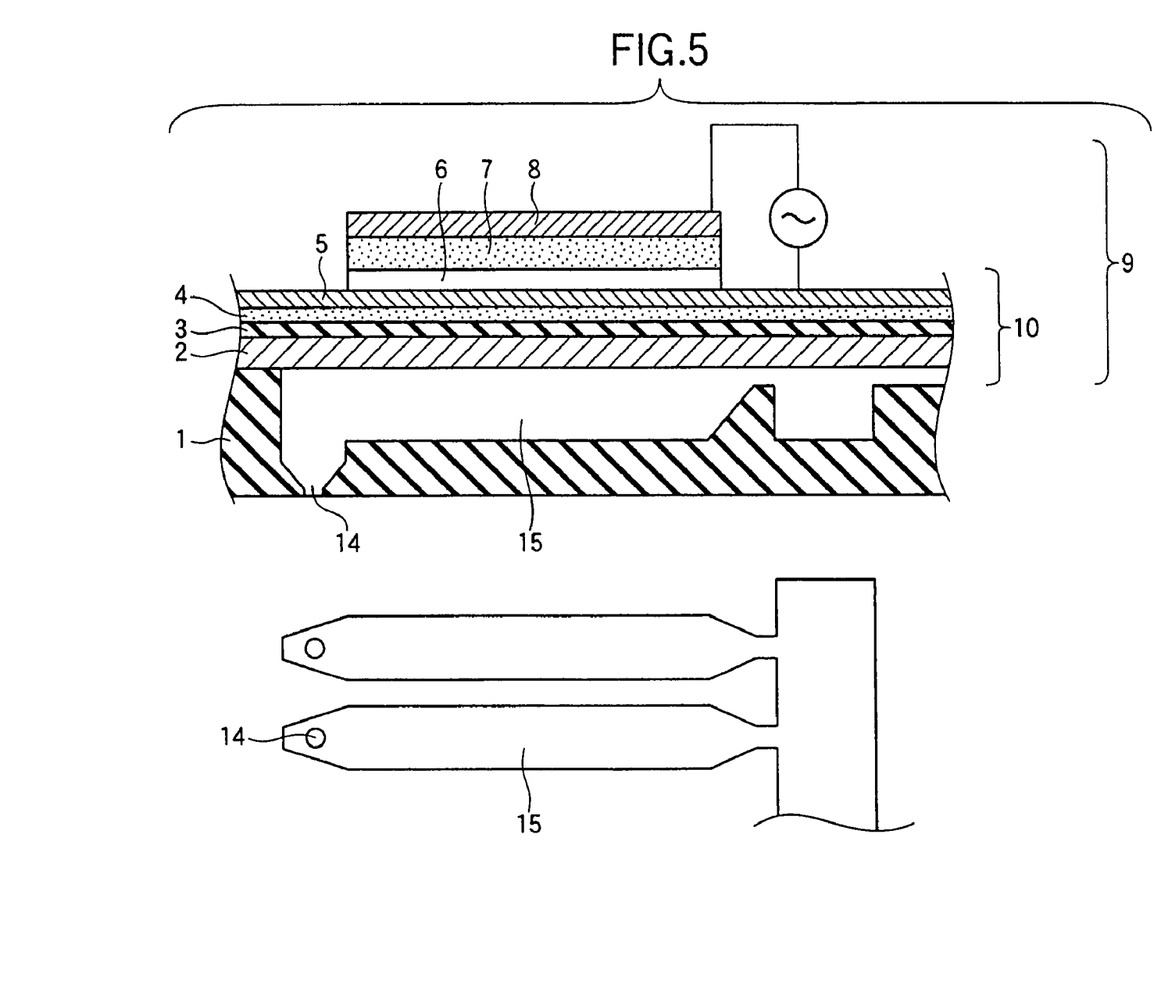
FIG. 5 is a schematic cross-sectional view of an ink jet head in example 7 of the present invention.

Referring to FIG. 5, the liquid discharge head of the present invention is provided with a liquid discharge port 14, a pressure chamber 15 communicating with the liquid discharge port 14, a vibrating plate 10 constituting a part of the pressure chamber 15, and a piezoelectric actuator unit 9 provided outside the pressure chamber 15 for providing the vibrating plate 10 with vibration. The liquid discharge port 14 generally has the shape of a nozzle. As mentioned, a part of the pressure chamber 15 is constituted by the vibrating plate 10, and in an external part thereof at least the aforementioned piezoelectric actuator is provided to constitute the ferroelectric actuator unit of the liquid discharge head.

In the liquid discharge head of such configuration, a predetermined voltage is applied to the epitaxial ferroelectric film of the piezoelectric actuator to cause an extension-contraction motion of the epitaxial ferroelectric film having the piezoelectric property, thereby generating a bending vibration to change the volume of the pressure chamber and to generate pressure therein, whereby a liquid is supplied from a liquid supply unit and is discharged from the discharge port (also represented as a nozzle). The discharge liquid can be any of various solutions or an ink.

In the liquid discharge head of the present invention, if the nozzle for liquid discharge is present in plural units, the piezoelectric actuator unit of the present invention generally has a structure basically divided for each nozzle. However, there may be adopted a structure divided not for each nozzle but for each pressure chamber, or for every several pitches.

Also, in the case of dividing the piezoelectric actuator of the liquid discharge head of the present invention, it is not necessary to separate all the components from the substrate to the upper electrode but it is possible to separate the epitaxial ferroelectric film and the upper electrode or the upper electrode alone.

Between the divided piezoelectric actuator units, a resin of a low rigidity or the like may be present as long as the extension-contraction motion of each ferroelectric actuator is not hindered. The shape of the pressure chamber can be arbitrarily selected, such as rectangular, circular or oval. Also, in the case of a head which discharges liquid in a direction perpendicular to the longitudinal direction of the pressure chamber, the cross-sectional shape of the pressure chamber may be so formed as to be contracted toward the nozzle.

Furthermore, in the liquid discharge head of the present invention, the piezoelectric actuator unit may also be constructed by adjoining the ferroelectric actuator to the vibrating plate constituting a part of the pressure chamber, and, for example, the vibrating plate may be constituted by the substrate itself of the piezoelectric actuator. In such case, the substrate preferably has the properties of having a crystal orientation, and of being capable of epitaxially growing at least the lower electrode and the ferroelectric film, and also properties suitable as the vibrating plate. In such case, it is also possible to use, as the substrate, a substrate lacking an orientation property, such as stainless steel or glass, on which a ferroelectric film having a single crystal structure or a crystal orientation property is epitaxially grown across a buffer layer. Also, the liquid discharge head of the present invention may have a configuration including a piezoelectric actuator unit prepared by adhering a piezoelectric actuator of the present invention to the vibrating plate.

Also, in the piezoelectric actuator or the liquid discharge head mentioned in the foregoing, if a buffer layer is provided between the substrate and the epitaxial ferroelectric film and the buffer layer has a dielectric property, the thickness of the buffer layer is preferably made small since the piezoelectric displacement depends on an effective electric field applied to the epitaxial ferroelectric film having the piezoelectric property.

The piezoelectric actuator of the present invention shows excellent piezoelectric characteristics because of a high spontaneous polarization of the epitaxial ferroelectric film, and it is also free from film peeling and from deterioration of the characteristics of the epitaxial ferroelectric film upon application of a stress in the epitaxial ferroelectric film along the planar direction of the substrate, and it can be easily made in a large area. Also, the liquid discharge head of the present invention, including the aforementioned piezoelectric actuator in the piezoelectric actuator unit, provides a large discharging power with a high density, is excellent for high frequency driving and is suitable for forming a large area.

EXAMPLES

In the following, the ferroelectric thin film element of the present invention and the producing method thereof will be explained in detail by examples, with reference to the accompanying drawings. In the following examples and comparative examples, $z/z_0$, $x/x_0$ and the crystal orientation rate were adjusted by regulating the film forming conditions of the epitaxial ferroelectric member (sputtering power, film forming temperature, cooling speed, sputtering gas pressure, sputtering gas species, target-substrate distance, target density etc.).

Example 1

Figure 1:
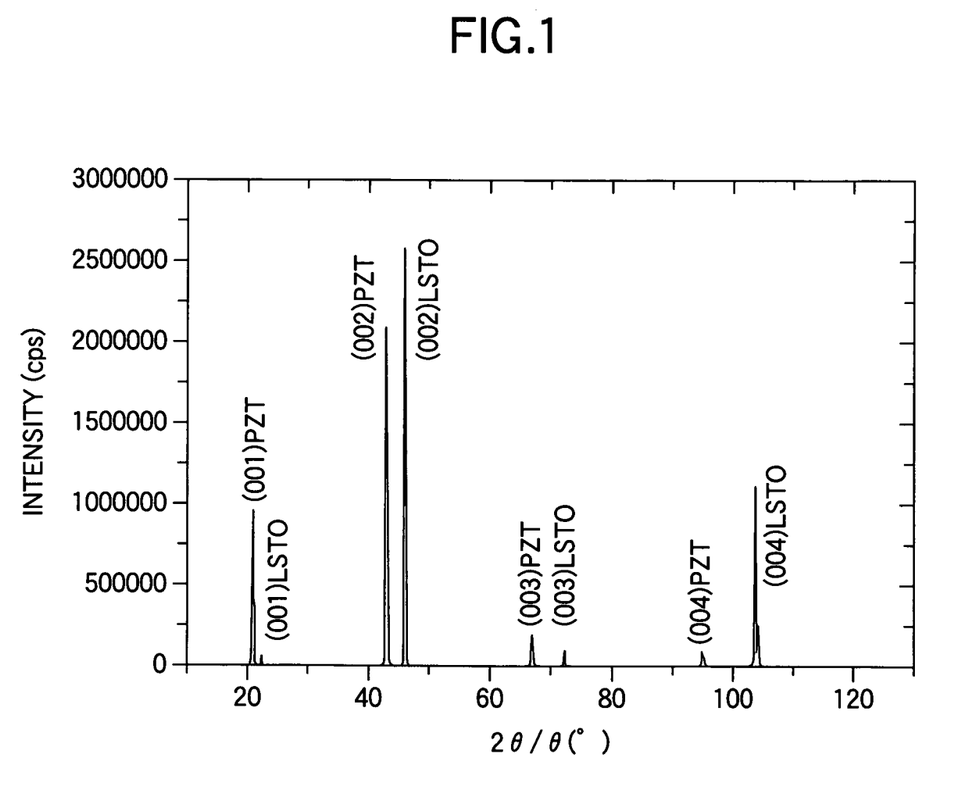
FIG. 1 is a view showing an XRD pattern of a PZT thin film of a ferroelectric thin film element in example 1 of the present invention.

On a substrate (single crystal growing substrate) ($La_{0.038}$, $Sr_{0.962}$)$TiO_3$ (100) serving also as an electrode, a PZT thin film of a thickness of 70 nm was epitaxially grown as an epitaxial ferroelectric thin film by a sputtering apparatus using an RF magnetron method, thereby obtaining a ferroelectric thin film element. In this operation, there were employed a substrate temperature of 600° C., an argon/oxygen ratio of 30/1 at film formation, a gas pressure of 0.2 Pa, an RF power of 0.8 W/cm² at film formation and a cooling speed after film formation of 100° C./min until 180° C. or lower was reached, and a pre-sputtering prior to film formation was conducted for 3 minutes with an RF power of 0.3 W/cm². The PZT thin film, constituting the epitaxial ferroelectric thin film, had a composition of Pb($Zr_{0.52}$, $Ti_{0.48}$)$O_3$. The single crystal property of the PZT thin film of the thus prepared ferroelectric thin film element was measured by XRD. The obtained result is shown in FIG. 1. Based on the result shown in FIG. 1, it was confirmed that the PZT thin film had a tetragonal crystal structure, a Z crystal face of (001) and a crystal orientation rate of 100%.

Figure 2:
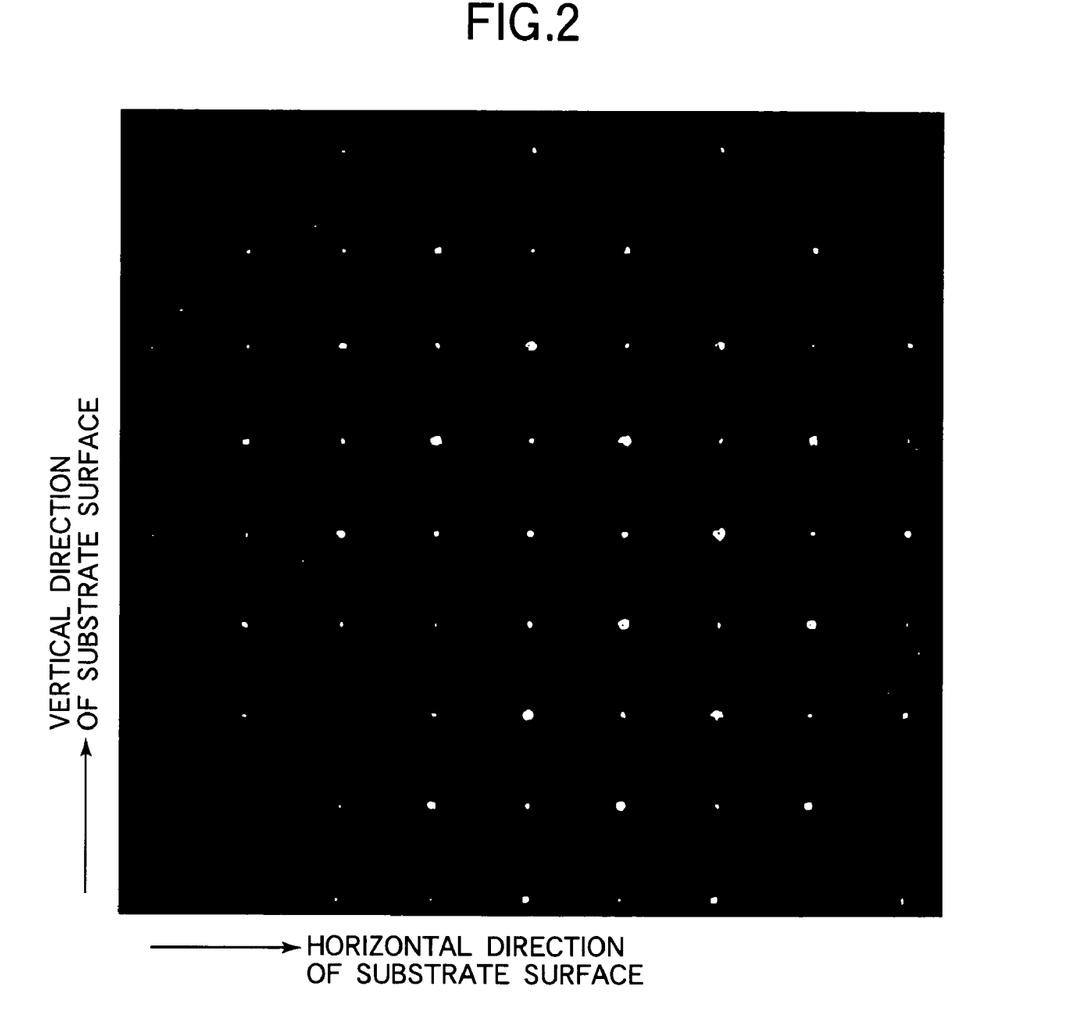
FIG. 2 is a view showing an electron diffraction image of the ferroelectric thin film element in example 1 of the present invention.

Also, an electron beam diffraction was conducted by introducing an electron beam from [010], which is perpendicular to a normal to the Z crystal face. The obtained result is shown in FIG. 2. Based on the result shown in FIG. 2, it was confirmed that the PZT thin film had a single crystal structure a film growing face of which was (001).

Then a- and c-axis lattice constants were calculated from diffraction peaks of a (004) face of the PZT thin film obtained in an XRD-2θ/θ measurement of a face of the PZT thin film horizontal to the substrate, and from diffraction peaks of a (004) face of the PZT thin film obtained in an XRT-2$θ_χ$/φ measurement of a face of the PZT thin film perpendicular to the substrate. The measurements were conducted with an X-ray diffraction apparatus Rint-Inplane (trade name), manufactured by Rigaku Denki Co., with an X-ray output of 40 kV at 50 mA and with, slits of 0.5° at a light receiving side and a detection side. As a result, there were obtained a=4.041 Å and c=4.162 Å. A reference (JCPDS-3320784) for tetragonal bulk ceramics of PZT of a composition of Zr:Ti=52:48 describes lattice constants $a_0$=4.036 Å and $c_0$=4.146 Å, and $z/z_0$=$c/c_0$=1.0039 and $x/x_0$=$a/a_0$=1.0012.

On the thus obtained ferroelectric thin film element, a Pt pattern of a diameter of 100 μm was formed by sputtering, as an upper electrode, while a lower electrode was constituted of (La, St)$TiO_3$, and the ferroelectric property of the ferroelectric thin film element was evaluated by a Sawyer-Tower circuit. As a result, there were obtained a spontaneous polarization Ps=100 μC/cm² and a residual polarization Pr=45 μC/cm². Also a fatigue characteristics test was conducted on 10 spots on the piezoelectric Pt pattern of the ferroelectric thin film element. The evaluation was conducted under conditions of an applied voltage of ±5 V, an evaluation temperature of 70° C., a frequency of 1 kHz and a writing of $10^7$ times. As a result, no defective element was found in any of the evaluated 10 spots. The obtained results are summarized in Table 1.

Example 2

On a substrate (single crystal growing substrate) ($La_{0.038}$, $Sr_{0.962}$)$TiO_3$ (100) serving also as an electrode, a PZT thin film of a thickness of 70 nm was epitaxially grown as an epitaxial ferroelectric thin film by a sputtering apparatus using an RF magnetron method, thereby obtaining a ferroelectric thin film element. In this operation, there were employed a substrate temperature of 600° C., an argon/oxygen ratio of 30/1 at film formation, a gas pressure of 0.2 Pa, an RF power of 0.8 W/cm² at film formation and a cooling speed after film formation of 80° C./min until 180° C. or lower was reached, and a pre-sputtering prior to film formation was conducted for 30 minutes with an RF power of 0.3 W/cm². The PZT thin film, constituting the epitaxial ferroelectric thin film, had a composition of Pb($Zr_{0.52}$, $Ti_{0.48}$)$O_3$. The single crystal property of the PZT thin film of the thus prepared ferroelectric thin film element was measured by XRD. The obtained result is shown in FIG. 1. Based on the result shown in FIG. 1, it was confirmed that the PZT thin film had a tetragonal crystal structure, a Z crystal face of (001) and a crystal orientation rate of 90%.

Also, an electron beam diffraction was conducted by introducing an electron beam from [010], which is perpendicular to a normal to the Z crystal face. As a result, it was confirmed that the PZT thin film had a single crystal structure a film growing face of which was (001).

Then a- and c-axis lattice constants were calculated from diffraction peaks of a (004) face of the PZT thin film obtained in an XRD-2θ/θ measurement of a face of the PZT thin film horizontal to the substrate, and from diffraction peaks of a (004) face of the PZT thin film obtained in an XRT-2$θ_χ$/φ measurement of a face of the PZT thin film perpendicular to the substrate. As a result, there were obtained a=4.034 Å and c=4.163 Å; thus $z/z_0$=$c/c_0$=1.0042 and $x/x_0$=$a/a_0$=0.9995.

On the thus obtained ferroelectric thin film element, a Pt pattern of a diameter of 100 μm was formed by sputtering, as an upper electrode, while a lower electrode was constituted of (La, St)$TiO_3$, and the ferroelectric property of the ferroelectric thin film element was evaluated. As a result, there were obtained a spontaneous polarization Ps=90 μC/cm² and a residual polarization Pr=40 μC/cm². Also, a fatigue characteristics test was conducted on 10 spots on the piezoelectric Pt pattern of the ferroelectric thin film element. As a result, no defective element was found in any of the evaluated 10 spots. The obtained results are summarized in Table 1.

Example 3

A mirror polished Si (100) of 15 mm square was employed as a substrate, and its surface was at first etched with tetramethylammonium hydroxide (also represented as TMAH) (manufactured by Kanto Chemical Co.) for 10 minutes at room temperature, then washed with purified water and rinsed with an acetone vapor bath. Then, on this substrate, a YZT thin film of a thickness of 10 nm was formed by a sputtering apparatus using an RF magnetron method at a substrate temperature of 800° C. An XRD measurement after film formation confirmed that the YSZ film had a crystal orientation rate of 99% or higher in a [100] direction. Then a Pt film of 100 nm as a lower electrode was formed by sputtering at a substrate temperature of 600° C.

An XRD measurement after film formation confirmed that the Pt had a crystal orientation rate of 97% or higher in a [111] direction. Then, on these laminated films, a buffer layer of [PbTiO$_3$] (also represented as PT) of 7 nm was formed with a sputtering apparatus using an RF magnetron method, with a substrate temperature of 600° C. An XRD measurement after the film formation confirmed that the PT had a crystal orientation rate of 94% or higher in a [111] direction. Then a PZT thin film of 85 nm was formed as an epitaxial ferroelectric thin film with a sputtering apparatus using an RF magnetron type. In this operation, there were employed a substrate temperature of 600° C., an argon/oxygen ratio of 30/1 at film formation, a gas pressure of 0.2 Pa, an RF power of 0.8 W/cm$^2$ at film formation and a cooling speed after film formation of 100° C./min until 180° C. or lower was reached, and a pre-sputtering prior to film formation was conducted for 3 minutes with an RF power of 0.3 W/cm$^2$. The single crystal property of the PZT thin film of the thus prepared ferroelectric thin film element was measured by XRD. The obtained result is shown in FIG. 1. As a result, it was confirmed that the PZT thin film had a rhombic crystal structure, a Z crystal face of (111) and a crystal orientation rate of 92%. The PZT thin film had a composition of Pb(Zr$_{0.58}$Ti$_{0.42}$)O$_3$.

Then, a face spacing of a (222) face, constituting a Z crystal face of the rhombic PZT thin film, and a face spacing of a (−220) face perpendicular to the Z crystal face, were calculated from diffraction peaks of a (222) face of the PZT thin film, obtained in an XRD-2θ/θ measurement of a face of the PZT thin film horizontal to the substrate, and from diffraction peaks of a (−220) face of the PZT thin film, obtained in an XRT-2θ$_x$/φ measurement of a face of the PZT thin film perpendicular to the substrate. As a result, there were obtained d(222)=1.186 Å and d(−220)=1.433 Å. A reference (JCPDS-732022) for rhombic bulk ceramics of PZT of a composition of Zr/Ti=52/48 describes face spacings of d$_0$(222)=1.1821 Å d$_0$(−220)=1.4346 Å, and z/z$_0$=d(222)/d$_0$(222)=1.0035 and x/x$_0$=d(−220)/d$_0$(−220)=0.9987.

On the thus obtained ferroelectric thin film element, a Pt pattern of a diameter of 100 μm was formed by sputtering, as an upper electrode, while a lower electrode was constituted of Pt, and the ferroelectric property of the ferroelectric thin film element was evaluated by a Sawyer-Tower circuit. As a result, there were obtained a spontaneous polarization Ps=80 μC/cm$^2$ and a residual polarization Pr=35 μC/cm$^2$. Also, a fatigue characteristics test was conducted on 10 spots on the piezoelectric Pt pattern of the ferroelectric thin film element. The evaluation was conducted under conditions of an applied voltage of ±5 V, an evaluation temperature of 70° C., a frequency of 1 kHz and a writing of 10$^7$ times. As a result, no defective element was found in any of the evaluated 10 spots. The obtained results are summarized in Table 1.

Comparative Examples 1 to 3

Ferroelectric thin film elements were prepared by an epitaxial growth of a PZT thin film as an epitaxial ferroelectric thin film on a substrate with a sputtering apparatus using an RF magnetron method, and by adjusting z/z$_0$, x/x$_0$ and crystal orientation rate through regulation of the film forming conditions in the same manner as in Example 1, except that the cooling speed after film formation was not controlled below 400° C. and the pre-sputtering was conducted for 60 minutes with the same RF power as in the film formation. Obtained results are shown in Table 1.

Table 1

TABLE 1

|  | z/z$_0$ | x/x$_0$ | crystal orientation degree (%) | Ps (μC/cm$^2$) | Ps (μC/cm$^2$) | fatigue property (defect/all) |
|---|---|---|---|---|---|---|
| Ex. 1 | 1.0039 | 1.0012 | 100 | 100 | 45 | 0/10 |
| Ex. 2 | 1.0042 | 0.9995 | 90 | 90 | 40 | 0/10 |
| Ex. 3 | 1.0035 | 0.9987 | 92 | 80 | 35 | 0/10 |
| Comp. Ex. 1 | 1.0005 | 1.0022 | 95 | 70 | 28 | 0/10 |
| Comp. Ex. 2 | 1.0061 | 0.9922 | 99 | 100 | 35 | 5/10 |
| Comp. Ex. 3 | 1.0036 | 0.9968 | 80 | 75 | 30 | 3/10 |

Results shown in Table 1 indicate that, in all the ferroelectric thin film elements of the examples 1 to 3 of the present invention, the epitaxial ferroelectric thin film satisfied the relations of z/z$_0$>1.003 and 0.997≦x/x$_0$≦1.003. Also, the epitaxial ferroelectric thin film of the ferroelectric thin film elements of the examples had a crystal orientation degree of 90% or higher, a spontaneous polarization Ps of 80 μC/cm$^2$ or higher and a residual polarization Pr of 35 μC/cm$^2$. Also, the ferroelectric thin film elements passed fatigue tests of 10$^7$ times.

On the other hand, in the ferroelectric thin film element of comparative example 1, the epitaxial ferroelectric thin film showed a relation z/z$_0$≦1.003, and this ferroelectric thin film element cleared the fatigue test of 10$^7$ times but shows low ferroelectricity with a spontaneous polarization Ps of 70 μC/cm$^2$ and a residual polarization Pr of 28 μC/cm$^2$. In the ferroelectric thin film element of comparative example 2, the epitaxial ferroelectric thin film showed a relation z/z$_0$<0.997, and this ferroelectric thin film element, though showing a strong ferroelectricity, was unable to clear the fatigue test of 10$^7$ times in some cases. Also, in the ferroelectric thin film element of comparative example 3, the epitaxial ferroelectric thin film showed a relation z/z$_0$<0.997, a crystal orientation rate less than 90% and a low ferroelectricity with a spontaneous polarization Ps of 75 μC/cm$^2$ and a residual polarization Pr of 30 μC/cm$^2$, and was unable to clear the fatigue test of 10$^7$ times in some cases.

In the following, the piezoelectric actuator and the liquid discharge head of the present invention and the producing method thereof will be explained in detail by examples, with reference to the accompanying drawings. In the following examples and comparative examples, z/z$_0$, x/x$_0$ and crystal orientation degree were adjusted by regulating the film forming conditions of the epitaxial ferroelectric member (sputtering power, film forming temperature, cooling speed, sputtering gas pressure, sputtering gas species, target-substrate distance, target density etc.). In the examples, explanation will be given for a liquid discharge head and an ink jet head as examples.

Example 4

On a substrate (single crystal growing substrate) (La$_{0.038}$, Sr$_{0.962}$)TiO$_3$ (100) serving also as an electrode, a PZT thin film of a thickness of 2 μm was epitaxially grown as an epitaxial ferroelectric film by a sputtering apparatus of an RF magnetron type. In this operation, there were employed a substrate temperature of 600° C., an argon/oxygen ratio of 30/1 at film formation, a gas pressure of 0.2 Pa, an RF power of 0.8 W/cm$^2$ at film formation and a cooling speed after film formation of 100° C./min until 180° C. or lower was reached, and a pre-sputtering prior to film formation was conducted for 3 minutes with an RF power of 0.3 W/cm$^2$.

Figure 3:
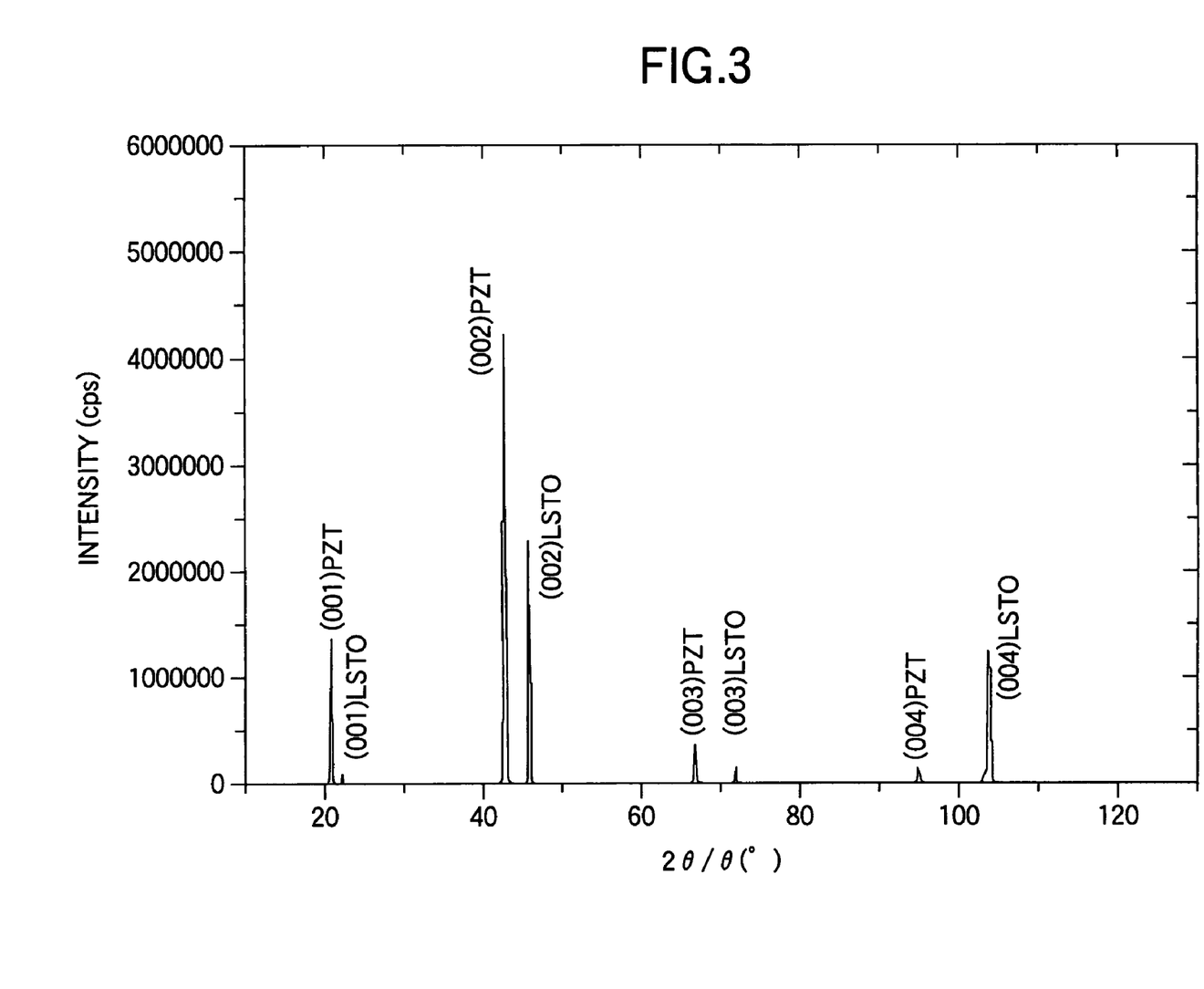
FIG. 3 is a view showing an XRD pattern of an epitaxial ferroelectric film of a ferroelectric thin film element in example 4 of the present invention.

The PZT film had a composition of Pb(Zr$_{0.52}$, Ti$_{0.48}$)O$_3$. The single crystal property of the thus prepared epitaxial ferroelectric film was measured by XRD. The obtained result is shown in FIG. 3. Based on the result shown in FIG. 3, it was confirmed that the PZT thin film had a tetragonal crystal structure, a Z crystal face of (001) and a crystal orientation rate of 100%.

Figure 4:
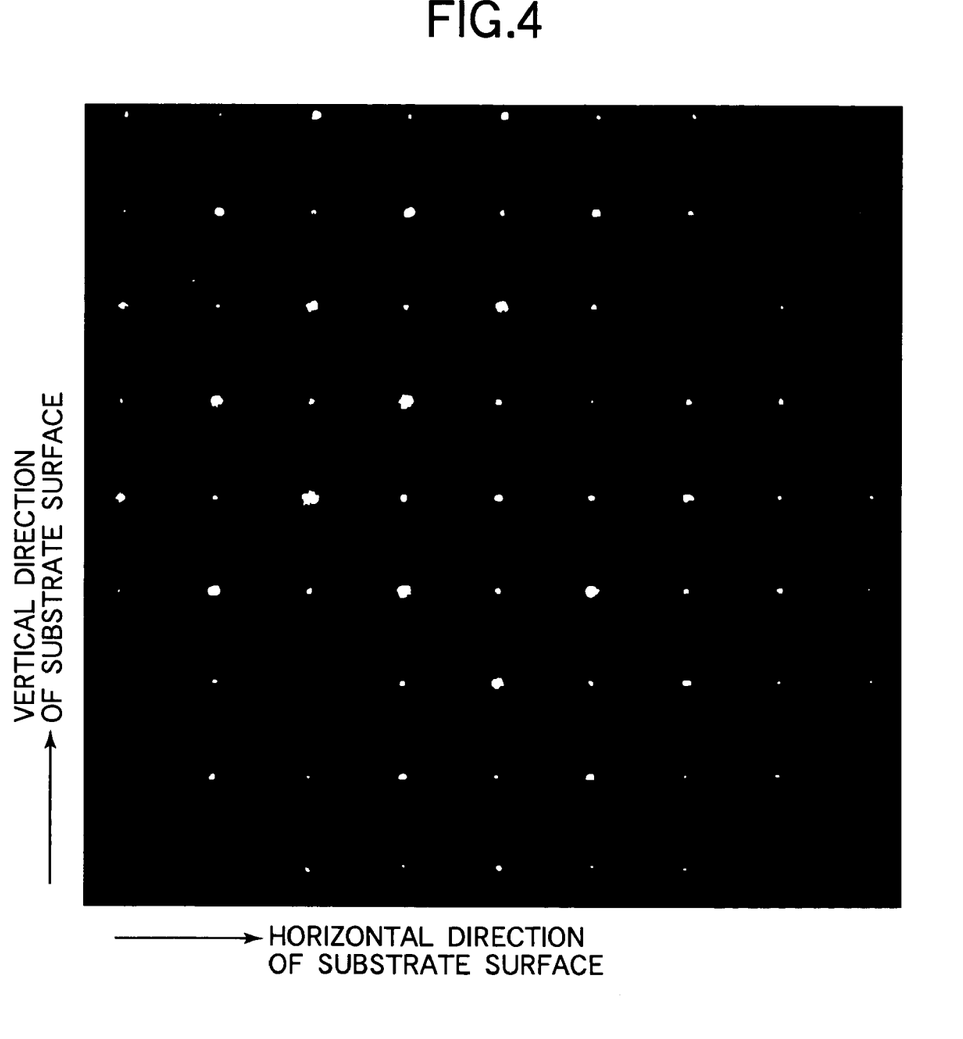
FIG. 4 is a view showing an electron diffraction image of the ferroelectric thin film element in example 4 of the present invention.

Also, an electron beam diffraction was conducted by introducing an electron beam from [010], which is perpendicular to a normal to the Z crystal face. The obtained result is shown in FIG. 4. Based on the result shown in FIG. 4, it was confirmed that the PZT film had a single crystal structure a film growing face of which was (001).

Then a- and c-axis lattice constants were calculated from diffraction peaks of a (004) face of the PZT film obtained in an XRD-2θ/θ measurement of a face of the PZT film horizontal to the substrate, and from diffraction peaks of a (004) face of the PZT film obtained in an XRT-2θ$_χ$/φ measurement of a face of the PZT film perpendicular to the substrate. The measurement was conducted with an X-ray diffraction apparatus Rint-Inplane (trade name), manufactured by Rigaku Denki Co., with an X-ray output of 40 kV at 50 mA and with slits of 0.5° at a light receiving side and a detection side. As a result, there were obtained a=4.042 Å and c=4.171 Å. A reference (JCPDS-3320784) for tetragonal bulk ceramics of PZT of a composition of Zr:Ti=52:48 describes lattice constants a$_0$=4.036 Å and c$_0$=4.146 Å, and z/z$_0$=c/c$_0$=1.0060 and x/x$_0$=a/a$_0$=1.0015.

On the thus obtained ferroelectric thin film element, a Pt pattern of a diameter of 100 μm was formed by sputtering as an upper electrode, thereby preparing a piezoelectric actuator with a lower electrode of (La, St)TiO$_3$. Such piezoelectric actuator was subjected to a measurement of the piezoelectric constant d33 with a piezoelectric constant measurement apparatus (manufactured by Toyo Technica Co.). There was obtained the result d33=498 pC/N.

Also, for the purpose of evaluating a displacement amount of such piezoelectric actuator, there was prepared a piezoelectric actuator in which an LSTO substrate also serves as a vibrating plate.

At first, a substrate (single crystal growing substrate) (La$_{0.038}$, Sr$_{0.962}$)TiO$_3$ (100) serving also as an electrode (also represented as an LSTO substrate) was adjoined to an Si (100) substrate, and a side of the LSTO substrate was ground until the LSTO reached a thickness of about 5 μm. Then a PZT film of 3.0 μm was formed as an epitaxial ferroelectric film, and a Pt electrode pattern was formed thereon by sputtering. Then the Si substrate was etched with a pattern of a length of 600 μm and a width of 40 μm by a dry etching processing, thereby preparing a cantilever of unimorph type in which the LSTO substrate constitutes a vibrating plate. The upper electrode was patterned in a length of 600 μm and a width of 40 μm as in the cantilever. A displacement amount of the thus prepared unimorph cantilever was measured with a laser Doppler measuring device, and was confirmed as 50 nm under a voltage application of 10 V.

A durability test was conducted on this piezoelectric actuator under conditions of an applied voltage of ±20 V, an evaluation temperature of 70° C., a frequency of 1 kHz and a writing of 10$^7$ times. As a result, there was not observed an attenuation of the displacement by deterioration or peeling of the film.

Results of the durability test for the piezoelectric actuator were evaluated according to the following criteria:

+: displacement amount after durability test was greater than 70% of the displacement amount prior to the durability test;

−: displacement amount after durability test was equal to or less than 70% of the displacement amount prior to the durability test.

The obtained results are summarized in Table 2.

Example 5

On a substrate (single crystal growing substrate) (La$_{0.038}$, Sr$_{0.962}$)TiO$_3$ (100) serving also as an electrode, a PZT thin film of a thickness of 3.0 μm was epitaxially grown as an epitaxial ferroelectric film by a sputtering apparatus of an RF magnetron type. In this operation, there were employed a substrate temperature of 600° C., an argon/oxygen ratio of 30/1 at film formation, a gas pressure of 0.2 Pa, an RF power of 0.8 W/cm$^2$ at film formation and a cooling speed after film formation of 80° C./min until 180° C. or lower was reached, and a pre-sputtering prior to film formation was conducted for 3 minutes with an RF power of 0.3 W/cm$^2$. The PZT film had a composition of Pb(Zr$_{0.52}$, Ti$_{0.48}$)O$_3$. The single crystal property of the thus prepared epitaxial ferroelectric film was measured by XRD. The obtained result is shown in FIG. 3. Based on the result shown in FIG. 3, it was confirmed that the PZT thin film had a tetragonal crystal structure, a Z crystal face of (001) and a crystal orientation rate of 90%.

Also, an electron beam diffraction was conducted by introducing an electron beam from [010], which is perpendicular to a normal to the Z crystal face. Based on the result, it was confirmed that the PZT film had a single crystal structure a film growing face of which was (001).

Then a- and c-axis lattice constants were calculated from diffraction peaks of a (004) face of the PZT film obtained in an XRD-2θ/θ measurement of a face of the PZT film horizontal to the substrate, and from diffraction peaks of a (004) face of the PZT film obtained in an XRT-2θ$_χ$/φ measurement of a face of the PZT film perpendicular to the substrate. As a result, there were obtained a=4.033 Å and c=4.162 Å, with z/z$_0$=c/c$_0$=1.0039 and x/x$_0$=a/a$_0$=0.9993.

On the thus obtained ferroelectric thin film element, a Pt pattern of a diameter of 100 μm was formed by sputtering as an upper electrode, thereby preparing a piezoelectric actuator with a lower electrode of (La, St)TiO$_3$. Such piezoelectric actuator was subjected to a measurement of the piezoelectric constant d33 as in Example 4. There was obtained a result d33=450 pC/N.

Also, for the purpose of evaluating a displacement amount of such piezoelectric actuator, there was prepared a piezoelectric actuator in which an LSTO substrate also serves as a vibrating plate.

At first, a substrate (single crystal growing substrate) (La$_{0.038}$, Sr$_{0.962}$)TiO$_3$ (100) serving also as an electrode (also represented as an LSTO substrate) was adjoined to an Si (100) substrate, and a side of the LSTO substrate was ground until the LSTO reached a thickness of about 5 μm. Then a PZT film of 3.0 μm was formed as an epitaxial ferroelectric film, and a Pt electrode pattern was formed thereon by sputtering. Then the Si substrate was etched with a pattern of a length of 600 μm and a width of 40 μm by a dry etching processing, thereby preparing a cantilever of unimorph type in which the LSTO substrate constitutes a vibrating plate. The upper electrode was patterned in a length of 600 μm and a width of 40 μm as in the cantilever. A displacement amount of the thus prepared unimorph cantilever was measured with a laser Doppler measuring device, and was confirmed as 46 nm under a voltage application of 10 V.

A durability test was conducted on this piezoelectric actuator under conditions of an applied voltage of ±20 V, an evaluation temperature of 70° C., a frequency of 1 kHz and a writing of $10^7$ times. As a result, there was not observed an attenuation of the displacement by deterioration or peeling of the film. The obtained results are summarized in Table 2.

Example 6

A mirror polished Si (100) was employed as a substrate, and its surface was at first etched with tetramethylammonium hydroxide (also represented as TMAH) (manufactured by Kanto Chemical Co.) for 10 minutes at room temperature, then washed with purified water and rinsed with an acetone vapor bath. Then, on this substrate, a YZT film of a thickness of 10 nm was formed by a sputtering apparatus using an RF magnetron method at a substrate temperature of 800° C. An XRD measurement after film formation confirmed that the YSZ film had a crystal orientation rate of 99% or higher in a [100] direction.

Then a Pt film was formed by 100 nm as a lower electrode by sputtering at a substrate temperature of 600° C. An XRD measurement after film formation confirmed that the Pt had a crystal orientation rate of 97% or higher in a [111] direction. Then, on these laminated films, a buffer layer of [$PbTiO_3$] (also represented as PT) of 7 nm was formed with a sputtering apparatus using an RF magnetron method, with a substrate temperature of 600° C. An XRD measurement after film formation confirmed that the PT had a crystal orientation rate of 94% or higher in a [111] direction.

Then, a PZT thin film of 3.0 μm was formed as an epitaxial ferroelectric thin film with a sputtering apparatus of an RF magnetron type. In this operation, there were employed a substrate temperature of 600° C., an argon/oxygen ratio of 30/1 at film formation, a gas pressure of 0.2 Pa, an RF power of 0.8 W/cm² at film formation and a cooling speed after film formation of 100° C./min until 180° C. or lower was reached, and a pre-sputtering prior to film formation was conducted for 3 minutes with an RF power of 0.3 W/cm². The single crystal property of the thus prepared epitaxial ferroelectric film was measured by XRD. As a result, it was confirmed that the PZT film had a rhombic crystal structure, a Z crystal face of (111) and a crystal orientation rate of 92%. The PZT thin film had a composition of $Pb(Zr_{0.58}Ti_{0.42})O_3$.

Then, a face spacing of a (222) face, constituting a Z crystal face of the rhombic PZT film, and a face spacing of a (−220) face perpendicular to the Z crystal face, were calculated from diffraction peaks of a (222) face of the PZT film, obtained in an XRD-2θ/θ measurement of a face of the PZT film horizontal to the substrate, and from diffraction peaks of a (−220) face of the PZT film, obtained in an XRT-$2\theta_x/\phi$ measurement of a face of the PZT film perpendicular to the substrate. As a result, there were obtained d(222)=1.187 Å and d(−220)=1.432 Å. A reference (JCPDS-732022) for rhombic bulk ceramics of PZT of a composition of Zr/Ti=52/48 describes face spacings of $d_0(222)=1.1821$ Å, $d_0(-220)=1.4346$ Å, and $z/z_0=d(222)/d_0(222)=1.0041$ and $x/x_0=d(-220)/d_0(-220)=0.9982$.

On the thus obtained ferroelectric thin film element, a Pt pattern of a diameter of 100 μm was formed by sputtering as an upper electrode, and a piezoelectric actuator was thus prepared with a lower electrode of $(La, Sr)O_3$. Such piezoelectric actuator was subjected to a measurement of the piezoelectric constant d33 with a piezoelectric constant measurement apparatus (manufactured by Toyo Technica Co.). There was obtained a result d33=471 pC/N.

Also, for the purpose of evaluating a displacement amount of such piezoelectric actuator, there was prepared a cantilever of a unimorph type, in which the Si substrate constitutes a vibrating plate, by etching the Si substrate to a thickness of about 5 μm by a dry process in a range of a length of 600 μm and a width of 40 μm. The displacement amount of the thus prepared unimorph cantilever was measured with a laser Doppler measuring device, and was confirmed as 46 nm under a voltage application of 10 V.

A durability test was conducted on this piezoelectric actuator under conditions of an applied voltage of ±20 V, an evaluation temperature of 70° C., a frequency of 1 kHz and a writing of $10^7$ times. As a result, there was not observed an attenuation of the displacement by deterioration or peeling of the film. The obtained results are summarized in Table 2.

Example 7

FIG. 5 shows a schematic cross-sectional view of an ink jet head of the present example. A substrate having a configuration of boron (B)-doped monocrystalline Si(100)/$SiO_2$/Si (layer thicknesses of 2.5 μm/1 μm/250 μm) was employed. In the figure, the Si layer is labeled 1, the $SiO_2$ layer is labeled 2, and the Si(100) layer is labeled 3. An MgO (100) film 4 was formed with a thickness of 0.3 μm on the Si (100) layer 3. Then a Pt (001) film 5 of 0.2 μm serving as an electrode, a PT (001) film 6 of 0.1 μm thereon, and a PZT film 7 of a thickness of 2 μm prepared under the same conditions as in example 4 as an epitaxial ferroelectric film having a piezoelectric property were prepared in succession by epitaxial growing. The PZT film had a composition of $Pb(Zr_{0.52}, Ti_{0.48})O_3$. Then an Au paste 8 was coated as an upper electrode, whereby a piezoelectric actuator unit was prepared.

The aforementioned Si layer was subjected to plasma etching with $SF_6$ and $C_4F_8$ to form a pressure chamber. Then an ink jet head shown in FIG. 5 was prepared by adjoining the Si substrate constituting a part of the pressure chamber and a nozzle plate. The pressure chamber had a width of 60 μm and a depth of 2.2 mm, and a partition of the pressure chamber had a width of 24 μm.

Then a- and c-axis lattice constants were calculated from diffraction peaks of a (004) face of the PZT film obtained in an XRD-2θ/θ measurement of a face of the PZT film of the piezoelectric actuator horizontal to the substrate, and from diffraction peaks of a (004) face of the PZT film obtained in an XRT-$2\theta_x/\phi$ measurement of a face of the PZT film perpendicular to the substrate. As a result, there were obtained a=4.040 Å and c=4.165 Å, with $z/z_0=c/c_0=1.0045$ and $x/x_0=a/a_0=1.0010$. An XRD measurement of the single crystal property confirmed that the PZT film had a tetragonal crystal structure, a Z crystal face of (001) and a crystal orientation rate of 99%.

As to an ink discharge from a nozzle in such an ink jet head, a stable ink discharge could be confirmed even with a drive frequency of 10 kHz and a drive voltage of 3 V. Also, a durability test of the ink jet nozzle was conducted with a drive frequency of 1 kHz and a drive voltage of 0 V/30 V. As a result, ink discharge was achieved in all the nozzles, and there was not observed film peeling or deterioration in the characteristics of the epitaxial ferroelectric film even after the durability test.

Comparative Examples 4 to 6

Piezoelectric actuators were prepared by epitaxial growth of a PZT film as an epitaxial ferroelectric film on a substrate with a sputtering apparatus using an .RF magnetron method, in which $z/z_0$, $x/x_0$ and crystal orientation rate were adjusted through regulation of the film forming conditions in the same manner as in example 5 except that the cooling speed after film formation was not controlled below 400° C. and the pre-sputtering was conducted for 60 minutes with the same RF power as in the film formation. Obtained results are shown in Table 2.

It was confirmed that the PZT films of the comparative examples 4 to 6 were tetragonal crystals and the Z crystal face was a (001) face. Table 2 also shows $z/z_0$ and $x/x_0$ of the PZT film, the piezoelectric constant d33 and the displacement amount of the piezoelectric actuator and an evaluation result of the piezoelectric actuator for the durability test. The piezoelectric actuator of comparative example 4 did not show satisfactory values in piezoelectric constant d33 and in the displacement amount of the piezoelectric actuator. Also, the piezoelectric actuator of comparative example 5 could not clear $10^7$ cycles, and was confirmed to show a reduction in the displacement amount. Also, the piezoelectric actuator of the comparative example 6 could not clear $10^7$ cycles, and was confirmed to show a reduction in the displacement amount.

Comparative Example 7

As a comparative example of example 7, an ink jet head of the following configuration was prepared. A substrate having a configuration of boron (B)-doped monocrystalline Si (100)/SiO$_2$/Si (layer thicknesses of 2.5 μm/1 μm/250 μm) was employed, and an MgO (100) film was formed with a thickness of 0.3 μm on the Si (100) layer. Then a Pt (001) film of 0.2 μm as an electrode, a PT (001) film of 0.1 μm thereon, and a PZT film of a thickness of 2 μm prepared under the same conditions as in example 4 as an epitaxial ferroelectric film having a piezoelectric property were prepared in succession by epitaxial growing. The PZT film had a composition of Pb(Zr$_{0.52}$, Ti$_{0.48}$)O$_3$. Then an Au paste was coated as an upper electrode, whereby a piezoelectric actuator unit was prepared.

The aforementioned Si layer was subjected to plasma etching with SF$_6$ and C$_4$F$_8$ to form a pressure chamber. Then an ink jet head similar to that in example 7 was prepared by adjoining the Si substrate constituting a part of the pressure chamber and a nozzle plate. The pressure chamber had a width of 60 μm and a depth of 2.2 mm, and a partition of the pressure chamber had a width of 24 μm.

Then a- and c-axis lattice constants were calculated from diffraction peaks of a (004) face of the PZT film obtained in an XRD-2θ/θ measurement of a face of the PZT film of the piezoelectric actuator horizontal to the substrate, and from diffraction peaks of a (004) face of the PZT film obtained in an XRT-2θ$_x$/ϕ measurement of a face of the PZT film perpendicular to the substrate. As a result, there were obtained a=4.012 Å and c=4.151 Å, with $z/z_0=c/c_0=1.0012$ and $x/x_0=a/a_0=0.9940$. An XRD measurement of the single crystal property confirmed that the PZT had a tetragonal crystal structure, a Z crystal face of (001) and a crystal orientation rate of 78%.

As to an ink discharge from a nozzle in such an ink jet head, a stable ink discharge could be confirmed even with a drive frequency of 10 kHz and a drive voltage of 7 V, but an ink discharge could not be observed at a drive frequency of 10 kHz and a drive voltage of 3 V. Also, in a durability test of the ink jet nozzle conducted with a drive frequency of 1 kHz and a drive voltage of 0 V/30 V, there was observed an ink discharge failure in plural nozzles in the discharge to $10^7$ cycles.

TABLE 2

|  | $z/z_0$ | $x/x_0$ | crystal orientation degree | d33 (pC/N) | displacement amount (nm) | piezoelectric actuator durability test |
|---|---|---|---|---|---|---|
| Ex. 4 | 1.0060 | 1.0015 | 100 | 498 | 50 | + |
| Ex. 5 | 1.0039 | 0.9993 | 90 | 450 | 46 | + |
| Ex. 6 | 1.0041 | 0.9982 | 92 | 471 | 46 | + |
| Comp. Ex. 4 | 1.0007 | 1.0019 | 95 | 347 | 28 | + |
| Comp. Ex. 5 | 1.0068 | 0.9895 | 99 | 505 | 45 | − |
| Comp. Ex. 6 | 1.0038 | 0.9958 | 80 | 375 | 36 | − |

Based on the results shown in Table 2 and explained above, in the piezoelectric actuators of examples 4 to 6 and the ink jet head of example 7, the epitaxial ferroelectric thin film satisfied the relations of $z/z_0>1.003$ and $0.997≦x/x_0≦1.003$. Also, the crystal orientation rate was 90% or higher. Also, the piezoelectric actuators of examples 4 to 6 had a piezoelectric constant d33 of 450 pC/N or higher, and a displacement amount of 46 nm or higher. Also, the piezoelectric actuators of examples 4 to 6 did not show, in a durability test, an attenuation in the displacement amount by deterioration or peeling of the ferroelectric film in the piezoelectric actuator unit. Also, as explained above, the ink jet head of example 7 did not show, after the fatigue test of $10^7$ times, film peeling of the epitaxial ferroelectric film in the piezoelectric actuator unit or defective discharge.

On the other hand, in the epitaxial ferroelectric film of the piezoelectric actuator of comparative example 4, the epitaxial ferroelectric thin film showed a relation $z/z_0<1.003$, and the piezoelectric actuator of comparative example 4 showed a low piezoelectric property with a piezoelectric constant d33 of 347 pC/N and a displacement amount of 28 nm.

In the piezoelectric actuator of comparative example 5, the epitaxial ferroelectric film showed a relation $z/z_0>1.003$. Therefore, the piezoelectric actuator of comparative example 5 showed a strong piezoelectric property with a piezoelectric constant d33 of 505 pC/N and a displacement amount of 45 nm, as in the examples, but, because of the relation $x/x_0<0.997$, the piezoelectric actuator of comparative example 5 could not clear the fatigue test of $10^7$ times.

In the piezoelectric actuator of comparative example 6, the epitaxial ferroelectric film showed a relation $z/z_0<0.997$, and a crystal orientation rate of a (001) face of the PZT film as low as 80%. Also, the piezoelectric actuator of comparative example 6 had a low piezoelectric property with a piezoelectric constant d33 of 375 pC/N and a displacement amount of 36 nm, and could not clear the fatigue test of $10^7$ times, thus indicating a reduction in the displacement amount.

What is claimed is:

1. A piezoelectric actuator comprising a substrate and an epitaxial ferroelectric film provided on said substrate, wherein said epitaxial ferroelectric film satisfies a relation $z/z_0>1.003$, where z is the c-axis lattice constant of the epitaxial ferroelectric film and $z_0$ is the c-axis lattice constant of a material constituting said epitaxial ferroelectric film in a bulk state, and
   wherein said epitaxial ferroelectric film also satisfies a relation $0.997<x/x_0<1.003$, where x is the a-axis lattice constant of the epitaxial ferroelectric film and $x_0$ is the a-axis lattice constant of a material constituting said epitaxial ferroelectric film in a bulk state, said epitaxial ferroelectric film has a thickness within a range of 100 nm to 10 µm, and said epitaxial ferroelectric film includes a lead (Pb) atom and an oxygen (O) atom as constituent atoms.

2. A piezoelectric actuator according to claim 1, further comprising at least a buffer layer between said substrate and said epitaxial ferroelectric film.

3. A piezoelectric actuator according to claim 2, wherein at least one of said substrate and said buffer layer is electroconductive.

4. A piezoelectric actuator according to claim 1, wherein a crystal orientation degree of a crystal plane of said epitaxial ferroelectric film parallel to a crystal plane of a surface of said substrate, measured by a 2θ/θ method with an X-ray incident angle θ to the crystal plane of said epitaxial ferroelectric film parallel to the crystal plane of the surface of said substrate, is 90% or higher.

5. A piezoelectric actuator according to claim 1, wherein a crystal plane of said epitaxial ferroelectric film parallel to a crystal plane of a surface of said substrate has a crystal orientation degree of 99% or higher.

6. A piezoelectric actuator according to claim 1, wherein said epitaxial ferroelectric film has a perovskite structure.

7. A piezoelectric actuator according to claim 1, wherein said epitaxial ferroelectric film has a tetragonal crystal structure and a crystal plane of said epitaxial ferroelectric film parallel to a crystal plane of a surface of said substrate is a (001) plane.

8. A piezoelectric actuator according to claim 1, wherein said epitaxial ferroelectric film has a rhombohedral crystal structure and a crystal plane of said epitaxial ferroelectric film parallel to a crystal plane of a surface of said substrate is a (111) plane.

9. A piezoelectric actuator according to claim 1, wherein said epitaxial ferroelectric film has a hexagonal crystal structure and a crystal plane of said epitaxial ferroelectric film parallel to a crystal plane of a surface of said substrate is a (0001) plane.

10. A piezoelectric actuator according to claim 1, wherein said epitaxial ferroelectric film has a rhombic crystal structure and a crystal plane of said epitaxial ferroelectric film parallel to a crystal plane of a surface of said substrate is a (011) plane.

11. A liquid discharge head for discharging a liquid utilizing a piezoelectric actuator according to claim 1.

12. A piezoelectric actuator according to claim 1, wherein said epitaxial ferroelectric film satisfies a relation $z/z_0 \leq 1.050$.

13. A piezoelectric actuator according to claim 1, wherein a residual polarization of said epitaxial ferroelectric film is 35 µC/cm$^2$ or higher.

14. A piezoelectric actuator according to claim 1, wherein a spontaneous polarization of said epitaxial ferroelectric film is 80 µC/cm$^2$ or higher.

* * * * *

UNITED STATES PATENT AND TRADEMARK OFFICE
CERTIFICATE OF CORRECTION

PATENT NO. : 7,215,067 B2
APPLICATION NO. : 10/772260
DATED : May 8, 2007
INVENTOR(S) : Ifuku et al.

Page 1 of 1

It is certified that error appears in the above-identified patent and that said Letters Patent is hereby corrected as shown below:

ON THE TITLE PAGE:
At Item (56), References Cited, Foreign Patent Documents, "06326270 A" should read --6-326270 A--, "10261933 A" should read --10-261933 A--, "10270939 A" should read --10-270939 A--, and "2000223662 A" should read --2000-223662 A--.

COLUMN 8:
Line 31, "an-underline" should read --an underline--.

COLUMN 16:
Table 1, "crystal orientation degree" should read --crystal orientation rate--.

COLUMN 22:
Table 2, "crystal orientation degree" should read --crystal orientation rate--.

COLUMN 23:
Line 13, "degree" should read --rate--.
Line 22, "degree," should read --rate--.

Signed and Sealed this

Twenty-fourth Day of February, 2009

JOHN DOLL
*Acting Director of the United States Patent and Trademark Office*